US006746970B2

(12) United States Patent
Liang et al.

(10) Patent No.: US 6,746,970 B2
(45) Date of Patent: Jun. 8, 2004

(54) METHOD OF FORMING A FLUOROCARBON POLYMER FILM ON A SUBSTRATE USING A PASSIVATION LAYER

(75) Inventors: Ming-Chung Liang, Hsinchu (TW); Chung Tai Chen, Hsinchu (TW); Hsin-Yi Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/178,795

(22) Filed: Jun. 24, 2002

(65) Prior Publication Data

US 2003/0234440 A1 Dec. 25, 2003

(51) Int. Cl.[7] ................................................ H01L 21/31

(52) U.S. Cl. ........................ 438/780; 438/778; 438/784; 438/786; 438/788; 438/789; 438/790; 438/793

(58) Field of Search ................................. 438/778, 780, 438/784, 786, 787, 788, 789, 790, 791, 792, 793, 794

(56) References Cited

U.S. PATENT DOCUMENTS 6,051,321 A * 4/2000 Lee et al. ................... 428/447
6,086,679 A * 7/2000 Lee et al. ................... 118/724
6,451,705 B1 * 9/2002 Trapp et al. ................ 438/723
6,521,546 B1 * 2/2003 Barnes et al. ............... 438/778

* cited by examiner

*Primary Examiner*—Nathan J. Flynn
*Assistant Examiner*—Thomas Magee
(74) *Attorney, Agent, or Firm*—Stout, Uxa, Buyan & Mullins, LLP

(57) ABSTRACT

A passivation layer is deposited onto the surface of a substrate followed by deposition of a polymer layer, through the application of a plasma enhanced chemical vapor deposition process, in which the substrate is placed on a chuck within a reaction chamber and fluorocarbon gas is introduced into the reaction chamber under the influence of at least one plasma source. The fluorocarbon gas can be a $CF_X$ gas. The at least one plasma source can include a first plasma source that ionizes the fluorocarbon gas by applying RF plasma energy, and a second plasma source that applies a near-zero self-bias to the substrate at an RF frequency during deposition of the passivation layer and a greater bias during deposition of the polymer layer. The passivation layer is deposited prior to the polymer layer to protect the surface of the substrate from damage during the deposition of the polymer layer.

17 Claims, 3 Drawing Sheets

METHOD OF FORMING A FLUOROCARBON POLYMER FILM ON A SUBSTRATE USING A PASSIVATION LAYER

BACKGROUND OF THE INVENTION

1. Field of the Invention

The present invention relates generally to insulative structures for use on semiconductor substrates and, more particularly, to plasma enhanced chemical vapor deposition methods for forming thin layers on integrated circuits.

2. Description of Related Art

As integrated circuit devices are progressively miniaturized, reduced interconnect (e.g., conductive lines and vias) separations and geometries can undesirably augment capacitances and resistances of the interconnect structures. These increased electrical properties can introduce, for example, cross talk noise and propagation delays between interlevel and intralevel conductive interconnects. The reduction or elimination of adverse capacitive couplings, for instance, could advantageously lead to enhanced device speed and reduced power consumption. In the context of integrated circuits, it is known that capacitance, for example, can be attenuated by employing insulating materials with lower dielectric constants.

Having one of the lowest dielectric constants of known inorganic materials, silicon dioxide ($SiO_2$) has long been used in integrated circuits as a primary insulating material. The addition of relatively small amounts of fluorine into silicon dioxide films has been found to lower the dielectric constant down into the low to mid three range. Further reduction of the dielectric constant, however, typically requires more advanced and committed uses of organic materials. On the topic of organic materials, fluorocarbon-based polymers have been recognized in the prior art as potentially attractive low-dielectric constant materials.

Plasma reactors can be used to deposit dielectric films onto the surfaces of integrated circuits. These plasma reactors ionize one or more gases with energy, which is typically in the form of radio frequency (RF) signals, in a plasma chamber. Energy from a RF plasma source may be inductively introduced into a plasma chamber, or the energy may be introduced via an electrode. The ionized gases adhere to the surfaces of the integrated circuits within the plasma reactors, thereby forming dielectric films on the integrated circuits. These techniques are generally referred to as plasma enhanced chemical vapor deposition (CVD) procedures. As an example, a fluorocarbon film may be produced by ionizing a fluorocarbon gas in a plasma reactor and then depositing the ionized gas onto an integrated circuit.

However, plasma enhanced CVD processes can be relatively difficult to control. In particular, the formation of a suitably thin and optimally distributed layer of fluorocarbon onto, for example, a dielectric material can be difficult. In cases where a fluorocarbon film is to be deposited onto a dielectric material, the fluorocarbon plasma can undesirably react with the dielectric material on which the film is to be deposited. For example, when the dielectric material comprises a patterned oxide or nitride material, the oxide or nitride material may be etched by the plasma instead of being coated with a dielectric film.

SUMMARY OF THE INVENTION

The present invention provides methods of depositing dielectric films onto materials, such as patterned dielectric materials, which would otherwise be susceptible to being etched under the deposition conditions. In accordance with one aspect of the present invention, a thin film is first deposited onto a patterned dielectric material as a passivation layer, and, subsequently, a dielectric (e.g., polymer) layer is deposited onto the patterned dielectric material without the underlying substrate and/or the patterned dielectric material being etched by the plasma. The dielectric layer, such as a fluorocarbon layer, can thus be successfully deposited onto the patterned dielectric material.

An object is to provide an improved method of depositing a thin, low-dielectric polymer film onto the surface of a substrate material, such as a patterned dielectric material, using a passivation layer so that the plasma does not adversely react with the substrate material.

To achieve these and other advantages and in accordance with a purpose of the present invention, as embodied and broadly described herein, the invention provides a method of forming a polymer layer on a patterned material, comprising the steps of: providing a substrate; forming a passivation layer over the substrate in a dual plasma source chamber; and forming a polymer layer on the passivation layer with an in-situ process. The substrate can have a patterned material formed thereon, and the passivation layer can be formed on the patterned material. The patterned material can comprise a silicon oxide layer or a silicon nitride layer, or can comprise, inter alia, a silicon layer. The passivation layer can be formed using a near-zero bias power to a thickness of about 10 to about 50 angstroms, wherein the passivation layer is directly adsorbed on the surface of the patterned material but not onto exposed surfaces of the substrate. The polymer layer can be formed using a $CF_X$ gas within a dual-RF source plasma chamber.

In accordance with another aspect of the present invention, a semiconductor construction comprises: a substrate; a patterned material formed on the substrate; a thin passivation layer on the patterned material, wherein the thin passivation layer is absorbed onto surfaces of the patterned material; and a polymer layer on the passivation layer. The patterned material can comprise a patterned dielectric material that is formed on the substrate.

According to another aspect of the present invention, a method of depositing a polymer layer on a patterned material comprises the steps of: placing a substrate having a patterned material formed thereon into a dual plasma-source reaction chamber; introducing a reaction gas into the reaction chamber; ionizing the reaction gas with a first plasma source to form a passivation layer; increasing a bias on the substrate with a second plasma source; and depositing a fluorocarbon film onto the passivation layer. The passivation layer can be formed on exposed surfaces of the patterned material, and the polymer layer can also be formed on exposed surfaces of the passivation layer.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
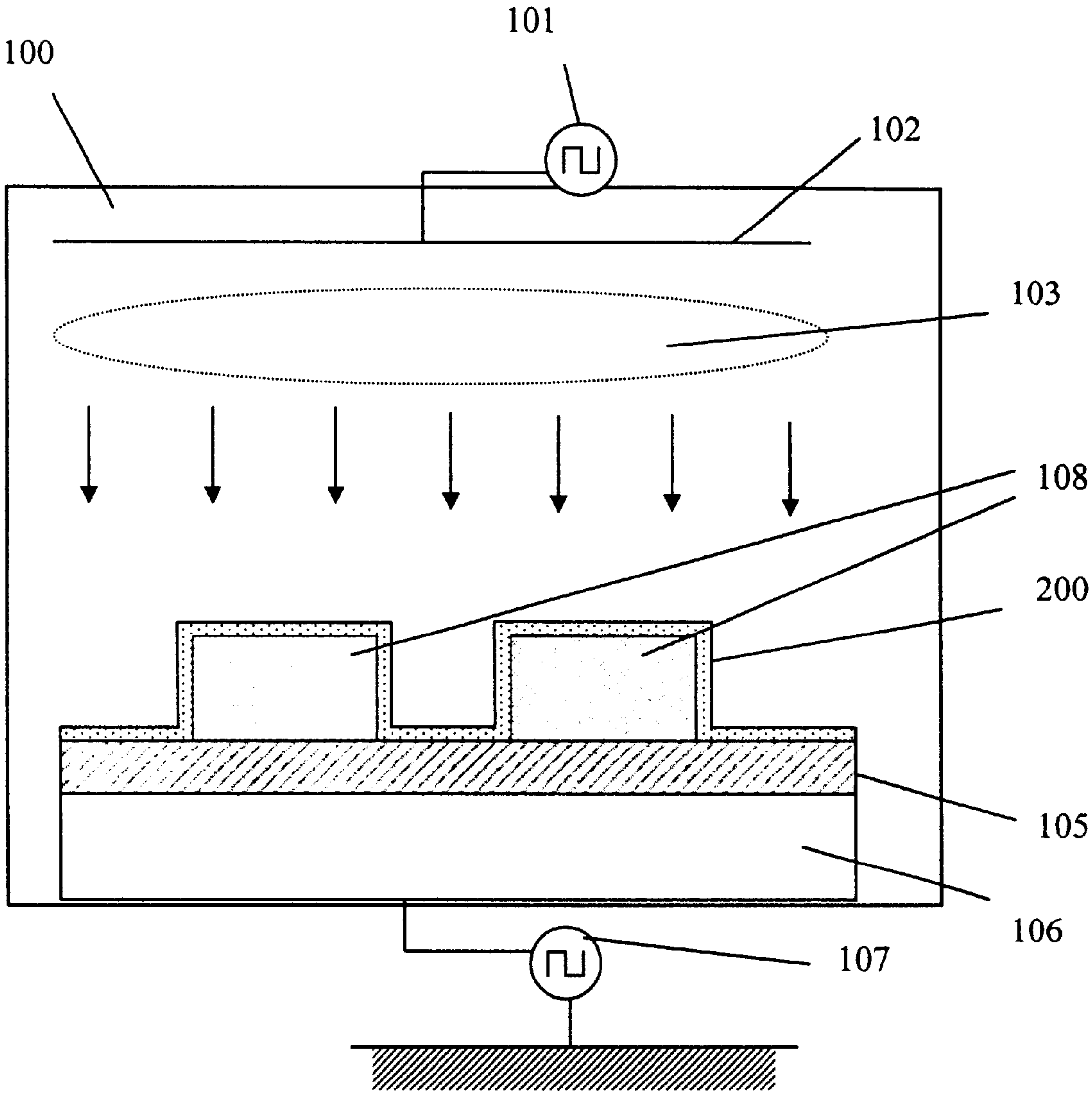
FIG. 1 is a cross-sectional view of a substrate having a passivation layer formed thereon within a dual plasma source apparatus in accordance with an exemplary embodiment of the present invention.

Reference will now be made in detail to the presently preferred embodiments of the invention, examples of which are illustrated in the accompanying drawings. Wherever possible, the same reference numbers are used in the drawings and the description to refer to the same or like parts. It should be noted that the drawings are in greatly simplified form and are not to precise scale. In the following description, numerous specific details are set forth illustrating Applicants' best mode for practicing the invention and enabling one of ordinary skill in the art to make and use the invention. It will be understood, however, to one skilled in the art that the present invention may be practiced in certain applications without these specific details. Thus, the illustrated embodiments set forth herein are presented by way of example and not by way of limitation.

The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the deposition of, for example, a passivation layer and a fluorocarbon film onto an integrated circuit substrate using first and second plasma sources. The present invention can be practiced in conjunction with various plasma enhanced chemical vapor deposition techniques and integrated circuit fabrication methods that are used in the art, and only so much of the commonly practiced process steps are included herein as are necessary to provide an understanding of the present invention. In certain instances, well-known machines and process steps have not been illustrated or described in particular detail in order to avoid unnecessarily obscuring the present invention.

Figure 2:
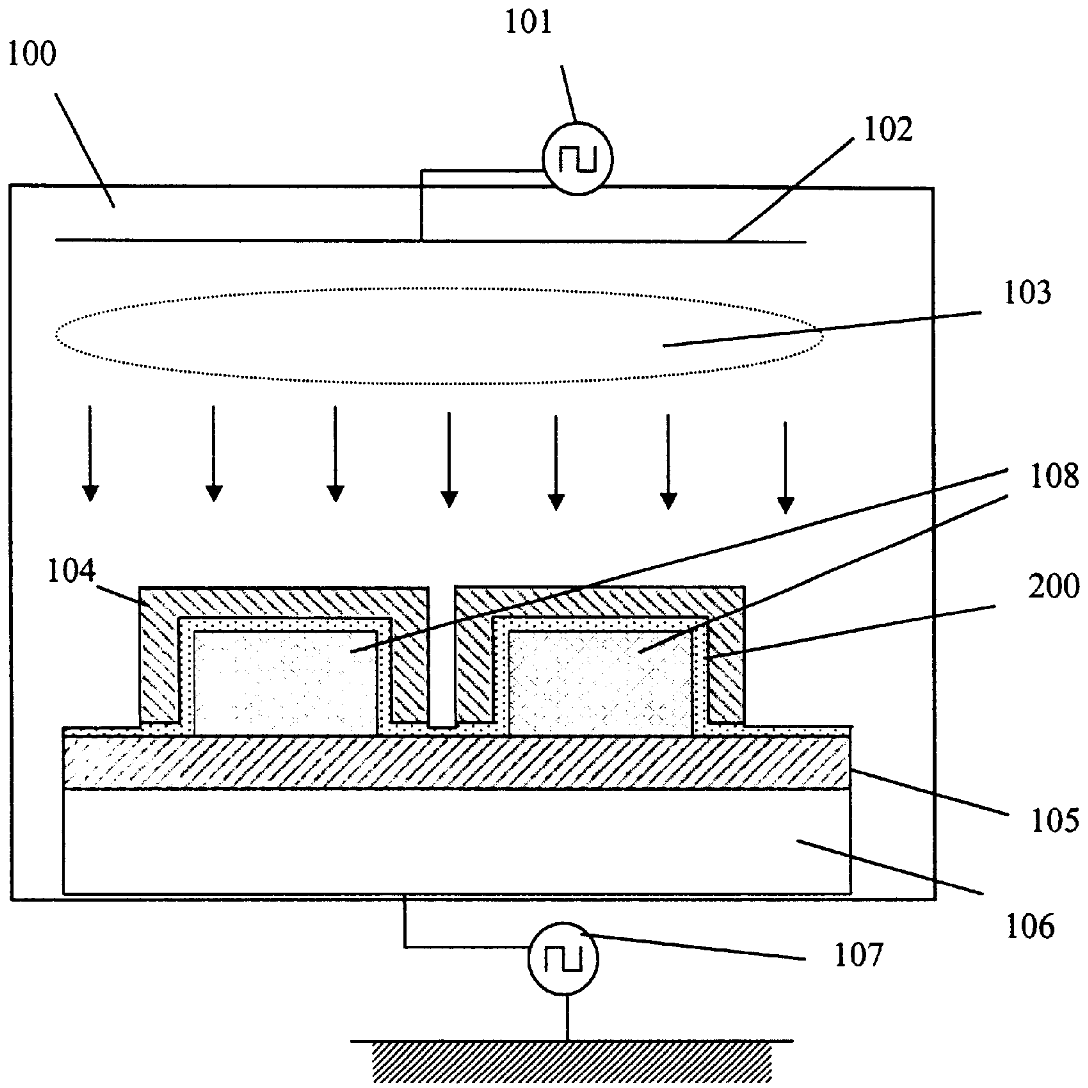
FIG. 2 is a cross-sectional view of FIG. 1 with the addition of a polymer layer over the passivation layer in accordance with an exemplary embodiment of the invention.

Referring more particularly to the drawings, an exemplary apparatus for practicing the process of the present invention on a substrate to thereby deposit a thin polymer material thereon is shown in FIGS. 1 and 2. The process of the present invention can be practiced in a controlled environment, which can be created within a reaction chamber 100. The reaction chamber 100 can be constructed from, for example, stainless steel, and is preferably gas-tight. In the illustrated embodiment, the reaction chamber 100 comprises a dual plasma etcher suitable for performing CVD processes.

The reaction chamber 100 comprises structures, such as a vacuum pump and pressure controller (not shown), that are constructed to generate a desired pressure within the chamber 100. As presently embodied, the walls of the chamber and surfaces of two electrodes 102 and 106 are coated with a film which is compatible with the plasma enhanced CVD process to be performed.

The reaction chamber 100 can further comprise a configuration, such as tanks and valves (not shown), that is adapted to efficiently pump one or more gases 103 at controlled rates into the reaction chamber 100. The gases 103 can be introduced into the reaction chamber 100 through one or more orifice structures (not shown), such as ring-shaped distributors or shower head assemblies or any other suitable structures for introducing gases in a distributed fashion into the reaction chamber 100 during the performance of a plasma enhanced CVD procedure. In one embodiment, the location of each orifice structure is in close proximity to the electrode 102. Each orifice structure can be disposed generally between the electrode 102 and the substrate 105, so that gases 103 entering into the reaction chamber 100 encounter RF plasma energy from the first plasma source 101 and are ionized between the electrode 102 and the chuck/electrode 106. The reaction chamber 100 can additionally comprise an exhaust port (not shown) for removing spent plasma and gases from the reaction chamber 100.

In accordance with the illustrated embodiment, a first plasma source 101 is used to generate energy, known as plasma energy, sufficient to ionize one or more gases 103 within the reaction chamber 100. In accordance with methods of the present invention, the first plasma source 101 can be operated (e.g., its power varied) to control the ion concentration of the ionized gases 103. The first plasma source 101 can be electrically coupled to an electrode 102, comprising, for example, a conductive material such as aluminum, as shown in FIG. 1.

In an alternative embodiment, the plasma energy may be inductively transmitted to the gases 103 within the reaction chamber 100. Inductively transmitting energy into the reaction chamber 100 may be accomplished, for example, by wrapping conductive coils around the reaction chamber 100 and then applying RF energy to the coils. A plasma region is thus generated inside the reaction chamber 100 even though the coils are on the outside.

As presently preferred, the plasma energy comprises radio frequency (RF) plasma energy. In particular, the first plasma source 101 can comprise a radio frequency (RF) modulator for generating high-frequency RF signals, which are transmitted from the first electrode 102 within the reaction chamber 100 in close proximity to the gases 103. In the illustrated embodiment, RF signals are transmitted at a frequency of 13.56 MHz, which is an industry standard for plasma energy generated in plasma enhanced CVD chambers. In modified embodiments, the RF plasma energy may be supplied at any other frequency that, when exposed to the gases 103 under suitable conditions, will ionize the gases 103, generating polymer radicals that can be deposited on the substrate 105.

A second plasma source 107 can be used to control the deposition process by, for example, self-biasing the substrate 105. The second plasma source 107 is preferably electrically (e.g., capacitively) connected to the chuck/electrode 106, and the chuck/electrode 106 in turn contacts the substrate 105 during the deposition operation to thereby self-bias the substrate 105. In particular, the second plasma source 107 preferably comprises a radio frequency (RF) modulator for generating high-frequency RF signals, which are transmitted to and radiate from the chuck/electrode 106. The RF signals are preferably transmitted at a frequency of 13.56 MHz, but in modified embodiments the RF plasma energy may be supplied at other frequencies.

Figure 3:
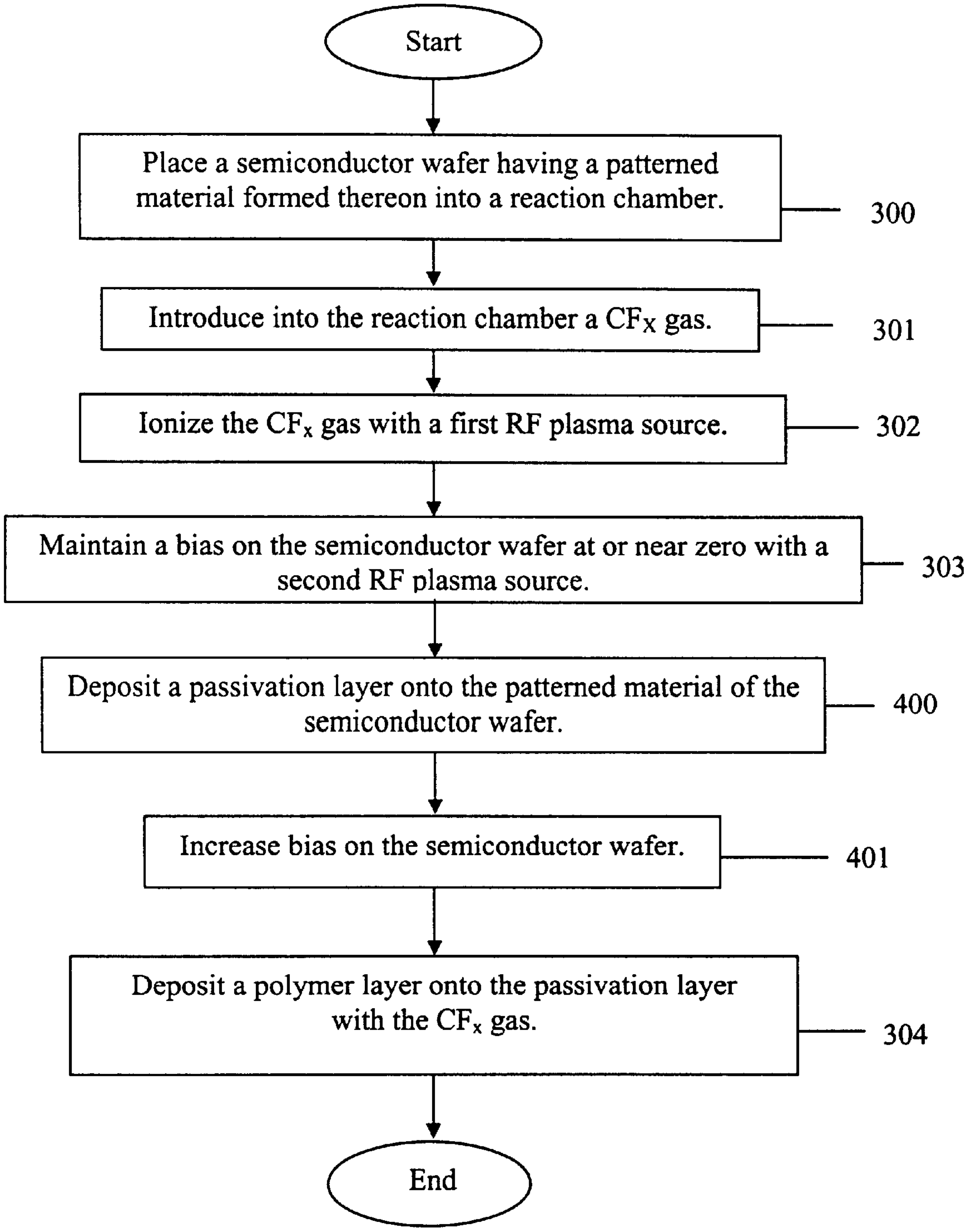
FIG. 3 is a flowchart in accordance with an exemplary process of the invention for depositing in sequence a passivation layer and a polymer layer on the substrate.

A preferred process will now be discussed with continued reference to FIGS. 1 and 2 and with reference to the flowchart in FIG. 3. The substrate 105, which preferably is a semiconductor wafer having a patterned material 108 formed thereon, is placed on the electrode/chuck 106 within the reaction chamber 100 at Step 300 as an initial step to the deposition process of the present invention. The chuck/electrode 106 holds and/or supports the substrate 105 and may be used as part of a thermal-control system (not shown) to control the temperature of the substrate 105 during the deposition process.

The substrate 105, as shown in FIG. 1, may be at an intermediate processing step during its manufacturing process and, thus, may comprise a patterned material layer 108 composed of, for example, silicon dioxide, silicon nitride, or silicon oxy-nitride. After placement of the substrate 105 within the reaction chamber 100, the reaction chamber 100 is sealed and then pressurized to an ambient pressure and temperature suitable for the desired process using, for example, a vacuum pump in combination with one or more reacting gases. While maintaining the desired pressure and temperature, one or more reacting gases 103 are introduced into the reaction chamber 100 at a controlled ratio and flow rate, as shown at Step 301. In modified embodiments, the desired pressure may be set either before, during (iteratively), or after the flow rates of the gases are set. In a preferred method, the reacting gas comprises a fluorocarbon ($CF_X$). The reacting gas can be, for example, $CH_2F_2$, $C_4H_8$, and the subsequently formed fluorocarbon layer(s) can comprise $CF_X$.

The gases 103 are introduced into the reaction chamber 100 at a flow rate so that, under sufficiently applied energy, a fluorine and carbon gas plasma will be formed in the reaction chamber 100. In Step 302, the first plasma source 101 is used to ionize the gases 103 by applying RF plasma energy at a frequency of about 13.56 MHz and at an energy level of about 800 to 1500 W to the electrode 102 in proximity to the gases 103. The RF plasma energy may alternatively be inductively coupled into the reaction chamber 100 to ionize the gases 103. The plasma energy in the reaction chamber 100 ionizes the introduced gases 103, generating, for example, radical species that may comprise monomer, oligomer and/or polymer radicals for deposition onto the surface of the patterned material 108. For example, a $CF_X$ gas introduced into the reaction chamber 100 may be ionized into radicals including fluorocarbon radicals (e.g., CF or $CF_2$) and fluorine (F or $F_2$) atoms/molecules.

The amount of gas 103 delivered to the reaction chamber 100 may be adjusted as needed to control the deposition process. For example, the flow rate of the gas 103 during the plasma enhanced CVD process can be the rate required to maintain the ambient pressure within the reaction chamber 100 at a desired range. In certain embodiments of the present invention, the deposition rate and process can be selectively controlled by altering one or more of the flow rates of the gases, the composition of the gases 103, the pressure within reaction chamber 100, the energy outputs of the first plasma source 101 and/or the second plasma source 107, and the substrate 105 temperature, so long as plasma enhanced CVD is maintained under the influence of at least one plasma source, which may be the first plasma source 101 and/or the second plasma source 107. In modified embodiments, other gasses, such as other carbon containing gases and/or fluorine containing gases, may be supplied alone or in combination with the above-described gases. The reacting gas may further comprise CO, Ar, $N_2$ and/or $O_2$. In one embodiment the reacting gas for forming the polymer layer (and/or the passivation layer) comprises all of the following: CO, Ar, $N_2$ and $O_2$.

In accordance with one aspect of the present invention, the use of CO and Ar in a certain proportion can facilitate control of the profile of the polymer layer over the patterned material. For example, for formation of the polymer layer, the range of CO can be controlled from 0 to about 150 sccm, and in a preferred embodiment from about 85 to about 115 sccm, and more preferably at about 100 sccm; and the range of Ar can be controlled from 0 to about 300 sccm, and more preferably from about 150 to about 300 sccm. In other embodiments, similar flow rates, or different flow rates, may be used to form the passivation layer.

In accordance with a feature of the present invention, the Applicants have noticed that under certain conditions the substrate 105 and/or patterned material 108, which is to be coated, can be damaged by undesired chemical reactions during the plasma enhanced CVD process. These reactions can be present for example when certain patterned materials 108 are used in combination with certain bias conditions. More particularly, in the case of $CF_X$ gas 103, for example, an electric field caused by the bias conditions can cause ions in the gas plasma to bombard the patterned material 108. The ion bombardment can damage the surfaces of the patterned material 108, resulting in the formation of unsatisfied bonds that quickly react with the ionized $CF_X$ gas to form volatile (gas) products. This reaction of the patterned material 108 and the ionized $CF_X$ gas causes etching (i.e., removal) of portions of the patterned material 108.

For example, when the patterned material 108 comprises a dielectric and the second plasma source 107 creates a substantial bias condition, the plasma may etch the patterned material 108 as distinguished from desirably being deposited onto the patterned material 108. In such an example, the patterned material 108 can comprise for example silicon dioxide ($SiO_2$) or silicon nitride ($Si_3N_4$). In the case where the patterned material 108 primarily consists of silicon dioxide the etching produces volatile products according to the following exemplary equation:

$$CF_X + SiO_2 \xrightarrow{\Delta E} SiF_X + CO_2 \qquad \text{Equation 1}$$

In the case where patterned material 108 primarily consists of silicon nitride, the etching produces volatile products according to the following exemplary equation:

$$CF_X + Si_3N_4 \xrightarrow{\Delta E} SiF_X + N_2 \qquad \text{Equation 2}$$

As evidenced from the above equations, an activation energy ΔE is required for initiation of the undesired etching reactions. In the case wherein the substrate 105 comprises silicon, upon introduction of an activation energy the Si can react with the F ions of the $CF_X$ to form volatile $SiF_X$. In another example, the patterned material 108 may comprise a polycrystalline silicon layer, in which case upon introduction of an activation energy the Si can also react with the F ions of the $CF_X$ to form volatile $SiF_X$.

The present invention seeks to maintain an energy level less than the activation energy ΔE on the substrate 105 and/or patterned material 108, so that etching will not occur. It has been noticed, however, in accordance with an aspect of present invention, that the ion bombardment caused by substantial biasing can undesirably increase energy levels on the substrate and/or patterned material 108, rather than reducing them.

With the increased energy levels on for example the patterned material 108, the activation energy ΔE is more likely to be met, resulting in the bonds of the patterned material 108 being more susceptible to being broken, yielding etching reactions. Thus, for patterned materials 108, which have relatively low activation energies and which are thus more prone to undergo undesirable reactions with the ionized gas 103, bias conditions can be reduced to thereby attenuate, and preferably eliminate, undesirable reactions.

This problem may be addressed in accordance with the present invention by first maintaining a near-zero bias on the substrate 105, at Step 303, to thereby form a thin passivation layer 200 using plasma enhanced CVD, at Step 400. The bias power may be kept low, and preferably is near zero (e.g., between 0 W and 200 W), for example, to prevent the ionized gases 103 used to form the passivation layer from bombarding and etching the substrate 105 and/or the patterned material 108; and the source power can be maintained at about 800 W to about 1500 W. Because there is little or no ion bombardment to break the bonds in for example the patterned material 108, ionized gases 103 are less likely to react with patterned material 108 and form volatile gas products. The activation energy necessary for the reaction between ionized gases 103 and the patterned material 108 is thus maintained at a relatively high value. The near-zero bias power therefore allows the passivation layer 200 to be directly adsorbed on the surface of the patterned material 108. In a preferred embodiment, $CF_x$ gas is used to form a passivation layer 200 having a thickness of between about 10 and 50 angstroms.

The patterned material 108 contacts first portions of the substrate 105 but does not contact second portions (i.e., exposed surfaces) of the substrate 105. The passivation layer 200 can thus be formed on the second portions of the substrate 105 and on exposed surfaces of the patterned material 108. As used herein, terms such as "second portions," "recesses," and "exposed surfaces of the substrate" will at times refer to surfaces between sidewalls of the patterned material 108 and will at other times refer to surfaces between, for example, the polymer layers 104 that are on the sidewalls of the patterned material 104. For such terms, the meanings as suggested from the contexts of the respective occurrences is intended.

Regarding the bias voltage, in accordance with one aspect of the present invention, this voltage can be mainly used to deposit material into recesses when the substrate is formed with features or blocks. Such recesses may comprise, for example, "second portions" as defined in the preceding paragraph. If the substrate is flat, the deposition may be performed even without the bias voltage. Thus, in accordance with an aspect of the present invention a near-zero bias can be applied to fill recesses, and at the same time can be controlled to keep the $\Delta E$ below the etching reaction value. In the illustrated embodiment, wherein the passivation layer 200 is deposited within recesses, the bias power is kept less than about 200 W. The bias power, however, can be varied depending on the materials and surface topographies of the substrate over which deposition is to be performed.

At Step 401, the polymer layer is formed using plasma enhanced CVD. In the illustrated embodiment wherein a patterned material 108 exists, a power of the second plasma source 107 is increased to facilitate deposition of the polymer layer 104 (FIG. 2). Additional control over the process is thus achieved by applying power to the second plasma source 107 at a frequency of, for example, about 13.56 MHz. RF plasma energy is applied from the second plasma source 107 to the chuck/electrode 106 to thereby apply a direct current (DC) voltage self-bias to the substrate 105 and patterned material 108, as measured by, for example, a suitably configured voltage meter.

Regarding formation of the polymer layer 104, an etcher can be utilized in combination with a recipe for controlling the deposition/etching ratio in reaction so as to form the polymer layer 104 on for example the sidewalls and/or top surfaces of the patterned material 108 (over the passivation layer 200). The thickness of the polymer layer 104 can be controlled at each portion of the surfaces of the patterned material 108 and substrate 105. Tuning the recipe of reaction can include changing the power, and in other embodiments can further include changing one or more of the flow rates of the gases, the composition of the gases, the pressure within the reaction chamber, the relative energy outputs of the first plasma source and/or the second plasma source, and the substrate temperature.

The polymer layer 104 can be selectively formed on surfaces of the patterned material 108 (over the passivation layer 200) using, for example, in whole or in part, the methods, apparatus and teachings disclosed in co-pending U.S. application Ser. No. 09/978,546, filed Oct. 18, 2001, and co-pending U.S. application Ser. No. 10/178,190, filed Jun. 24, 2002 and entitled Method for Fluorocarbon Film Depositing, the contents of both which are incorporated herein by reference. In a case wherein the deposition thickness on the top surface is lager than that on the sidewall, the polymer layer can be used as a protection layer to prevent the profile of the patterned material from being damaged during etching. In a case wherein the deposition thickness on the sidewall is chosen to be relatively large, the polymer layer can be used to attenuate the critical dimension of the recesses between features of the patterned material. By tuning the recipe of reaction, the surfaces between the patterned material 108 (i.e., the second portions) can be disposed with a polymer layer 104 in a thickness smaller than that on the top surfaces of the patterned material 108, or disposed with no polymer layer 104. In various embodiments and, preferably, in an embodiment wherein the polymer layer 104 is not disposed on the second portions, the passivation layer 200 on the second portions may be entirely etched away or, preferably, only slightly etched away. In the illustrated embodiment of FIG. 2, the passivation layer 200 is slightly etched away on the second portions.

In situations wherein the passivation layer 200 is not used and for example the recipe for forming the polymer layer 104 is not well controlled, the second portions and./or the patterned material 108 can be damaged (i.e., etched) during the CVD formation process of the polymer layer 104. Use of the passivation layer 200 can facilitate formation of the polymer layer 104 on a large variety of patterned materials 108, such as patterned photoresist, increasing an adhesion of the polymer layer 104 onto the patterned material 108 and attenuating etching reactions.

In one embodiment, the passivation layer 200 allows the polymer layer 104 to be deposited onto the patterned material at Step 304 with, for example, a bias power of about 700 W and a source power of about 1300 W. As a result of the passivation layer 200 the polymer layer 104 is absorbed onto the passivation layer with attenuated, and preferably, eliminated, etching. In the illustrated embodiment, the polymer layer is deposited on exposed surfaces of the passivation layer 200 but is not deposited on exposed surfaces of the substrate 105. The ionized gas 103, or plasma, is deposited onto and adheres to surfaces of the patterned material 108 covered by the passivation layer 200, thereby forming the polymer layer 104. In one embodiment, the compositions of elements within the passivation layer and the polymer layer are substantially the same, but the proportions of the elements making up the two layers differs.

To save processing time, the polymer layer 104, which is preferably a fluorocarbon polymer layer, may be generated in the same dual-RF source plasma chamber used for the formation of passivation layer. Once a desired film thickness has been achieved in accordance with Step 304, the process may be terminated and the substrate 105 removed, using conventional means such as an automated handler. The polymer layer 104 may be tested for proper deposition characteristics, including dielectric constant, thicknesses at one or more different locations, and/or uniformity of distribution at the one or more locations.

In view of the foregoing, it will be understood by those skilled in the art that the methods of the present invention can facilitate formation of dielectric layers having improved characteristics in relation to those of the prior art. The above-described embodiments have been provided by way of example, and the present invention is not limited to these examples. Multiple variations and modification to the disclosed embodiments will occur, to the extent not mutually exclusive, to those skilled in the art upon consideration of the foregoing description. The present invention for forming a polymer layer on a material layer, such as a patterned material layer, by way of a passivation layer can also be applied to other materials for which the activation energy of the reaction with the reactive gas plasma is not high enough. Such variations and modifications, however, fall well within the scope of the present invention as set forth in the following claims.

What is claimed is:

1. A method of forming a polymer layer on a patterned material, comprising the steps of:

a) providing a substrate, the substrate having a patterned dielectric material formed thereon;

b) forming a passivation layer over the substrate in a plasma chamber, the plasma chamber comprising a dual-RF source plasma chamber and the passivation layer being formed on the patterned material using a near-zero bias power; and c) forming a polymer layer on the passivation layer with an in-situ process.

2. The method of claim 1, wherein the patterned material comprises one of a silicon oxide layer and a silicon nitride layer.

3. The method of claim 1, wherein the patterned material comprises a silicon layer.

4. The method of claim 1, wherein the passivation layer is formed using a CFX gas.

5. The method of claim 4, wherein:

the polymer layer is formed using a CFX gas;

at least one of the passivation layer and the polymer layer is formed using a gas further comprising CO, Ar, N2 and O2; and the CO is provided at a flow rate of 0 to about 150 sccm and the Ar is provided at a flow rate of 0 to about 300 sccm.

6. The method of claim 5, wherein the CO is provided at a flow rate of about 85 to about 115 sccm and the Ar is provided at a flow rate of about 150 to about 300 sccm.

7. The method of claim 1, wherein the passivation layer is directly adsorbed on the surface of the patterned material.

8. The method of claim 1, wherein the polymer layer comprises a fluorocarbon polymer layer.

9. The method of claim 1, wherein the thickness of the passivation layer is between about 10 and 50 angstroms.

10. The method of claim 8, wherein the step of forming a polymer layer comprises the following steps:

providing a reacting gas comprising a CFX gas; and providing a first plasma source and a second plasma source to deposit a fluorocarbon film on the passivation layer with the CFX gas.

11. The method of claim 10, wherein the second plasma source comprises a radio frequency plasma source that is used to provide the substrate with a self-bias.

12. The method of claim 1, wherein the passivation layer is formed in step b) on exposed surfaces of both the substrate and the patterned material.

13. A method of depositing a polymer layer on a patterned material comprising the steps of:

placing a substrate having a patterned dielectric material formed thereon into a dual plasma-source reaction chamber;

introducing a reaction gas into the reaction chamber;

ionizing the reaction gas with a first plasma source and a near-zero bias power to form a passivation layer;

increasing a bias the substrate with a second plasma source; and depositing a fluorocarbon film onto the passivation layer.

14. The method of claim 13, wherein the passivation layer is formed on exposed surfaces of both the substrate and the patterned material.

15. The method of claim 14, wherein the polymer layer is formed over surfaces of the patterned material that were covered by the passivation layer but not over surfaces of the substrate that were covered by the passivation layer.

16. The method of claim 14, wherein:

the passivation layer and the polymer layer are formed using a gas comprising CFX, CO, Ar, N2 and O2; and the CO is provided at a rate of 0 to about 150 sccm and the Ar is provided at a flow rate of 0 to about 300 sccm.

17. The method of claim 12, wherein the polymer layer is formed in step c) over surfaces of the patterned material that were covered by the passivation layer but not over surfaces of the substrate that were covered with the passivation layer.

* * * * *